United States Patent
Qin et al.

(10) Patent No.: US 10,819,305 B2
(45) Date of Patent: Oct. 27, 2020

(54) METHOD AND DEVICE FOR ADJUSTING SOUND QUALITY

(71) Applicant: AAC Technologies Pte. Ltd., Singapore (SG)

(72) Inventors: Yingming Qin, Shenzhen (CN); Bing Xie, Shenzhen (CN); Zheng Xiang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/706,836

(22) Filed: Dec. 9, 2019

(65) Prior Publication Data

US 2020/0204135 A1    Jun. 25, 2020

(30) Foreign Application Priority Data

Dec. 25, 2018 (CN) .......................... 2018 1 1588256

(51) Int. Cl.
*H03G 5/00* (2006.01)
*H03G 5/16* (2006.01)
(Continued)

(52) U.S. Cl.
CPC .......... *H03G 5/165* (2013.01); *H03G 3/3005* (2013.01); *H04R 3/04* (2013.01); *H04R 29/001* (2013.01); *H03G 2201/103* (2013.01)

(58) Field of Classification Search
CPC ........ H03G 5/165; H03G 3/3005; H04R 3/04; H04R 29/001
See application file for complete search history.

(56) References Cited

U.S. PATENT DOCUMENTS

2009/0316930 A1* 12/2009 Horbach ................. H04S 7/301
                                                                381/99
2015/0304772 A1* 10/2015 Risberg .................. H04R 3/007
                                                                381/55
(Continued)

FOREIGN PATENT DOCUMENTS

CN        107734167 A1    2/2018
CN        108415556 A1    8/2018
(Continued)

OTHER PUBLICATIONS

1st Office Action dated Dec. 25, 2019 by SIPO in related Chinese Patent Application No. 201811588256.3 (7 Pages).
(Continued)

*Primary Examiner* — Simon King
(74) *Attorney, Agent, or Firm* — W&G Law Group LLP

(57) ABSTRACT

The embodiments of the present invention relate to the field of audio signal processing and disclose a method for adjusting sound quality, which includes: acquiring an audio signal to be adjusted; acquiring a resonance frequency and a frequency response curve of an exciter; forming a recursive filter and determining a filter parameter of the recursive filter according to the frequency response curve; inputting the audio signal to be adjusted into the recursive filter within a preset range of the resonance frequency to acquire an equalizing signal; performing preset sound effect processing on the equalizing signal to acquire a signal to be excited, wherein the preset sound effect processing at least includes inputting the equalizing signal into a non-recursive filter, and inputting the signal to be excited into the exciter to output an audio signal. The present invention further provides a tone quality adjusting device.

18 Claims, 7 Drawing Sheets

(51) Int. Cl.
*H03G 3/30* (2006.01)
*H04R 3/04* (2006.01)
*H04R 29/00* (2006.01)

(56) References Cited

U.S. PATENT DOCUMENTS

2017/0208392 A1* 7/2017 Smithers .................. H04R 3/04
2018/0239578 A1* 8/2018 Rossum .................... H04R 3/04
2019/0235475 A1* 8/2019 Deng ...................... H02K 33/00

FOREIGN PATENT DOCUMENTS

| CN | 108632708 A1 | 10/2018 |
| CN | 110018808 A1 | 7/2019 |

OTHER PUBLICATIONS

PCT search report dated Feb. 5, 2020 by SIPO in related PCT Patent Application No. PCT/CN2019/113336 (4 Pages).

* cited by examiner

METHOD AND DEVICE FOR ADJUSTING SOUND QUALITY

TECHNICAL FIELD

The embodiments of the present invention relate to the field of audio signal processing and more particularly, to a method and a device for adjusting sound quality.

BACKGROUND

As a smart phone that perfectly integrates a handset function with an IPS high definition screen, a smart phone with a sounding screen does not need to set a handset sounding hole on a front side of the phone. When a piezoelectric driver is powered on, a touch screen of the phone will vibrate, thus pushing air to generate sound. This design not only facilitates users to answer the call, but also makes the talking effect clearer. A full mirror design of the phone is realized and the waterproof and dustproof function of the front side of the phone can be implemented by the revolutionary elimination of the handset structure on the smart phone. The smart phone with a sounding screen needs to apply a screen sounding technology, which refers to the technology of placing an exciter behind the screen and driving the exciter to generate vibration and transmit the vibration to the screen so as to make the screen vibrate and sound.

It has been found by the inventors that the prior art at least has the following problems: if speech and music effects of the screen sounding technology are not processed, the vibration effect of the screen will be obvious, while noise and voice changes will be generated when the screen vibrates, causing the sound quality to be affected, thereby causing poor hearing experience to the users.

BRIEF DESCRIPTION OF THE DRAWINGS

One or more embodiments are illustrated by way of example through the figures in the corresponding accompanying drawings, which are not intended to limit the embodiments, and elements having the same reference numerals in the accompanying drawings are illustrated as similar elements. Unless otherwise stated, the figures in the accompanying drawings do not constitute a limitation of ratio.

DETAILED DESCRIPTION

To make the objects, technical solutions, and advantages of the embodiments of the present invention clearer, the embodiments of the present invention are further described in detail hereinafter with reference to the drawings. However, those skilled in the art can understand that, in the embodiments of the present invention, many technical details are proposed for readers to better understand the present invention. However, even without these technical details and various changes and modifications based on the following embodiments, the technical solutions sought to be protected by the present invention can also be realized.

Figure 1:
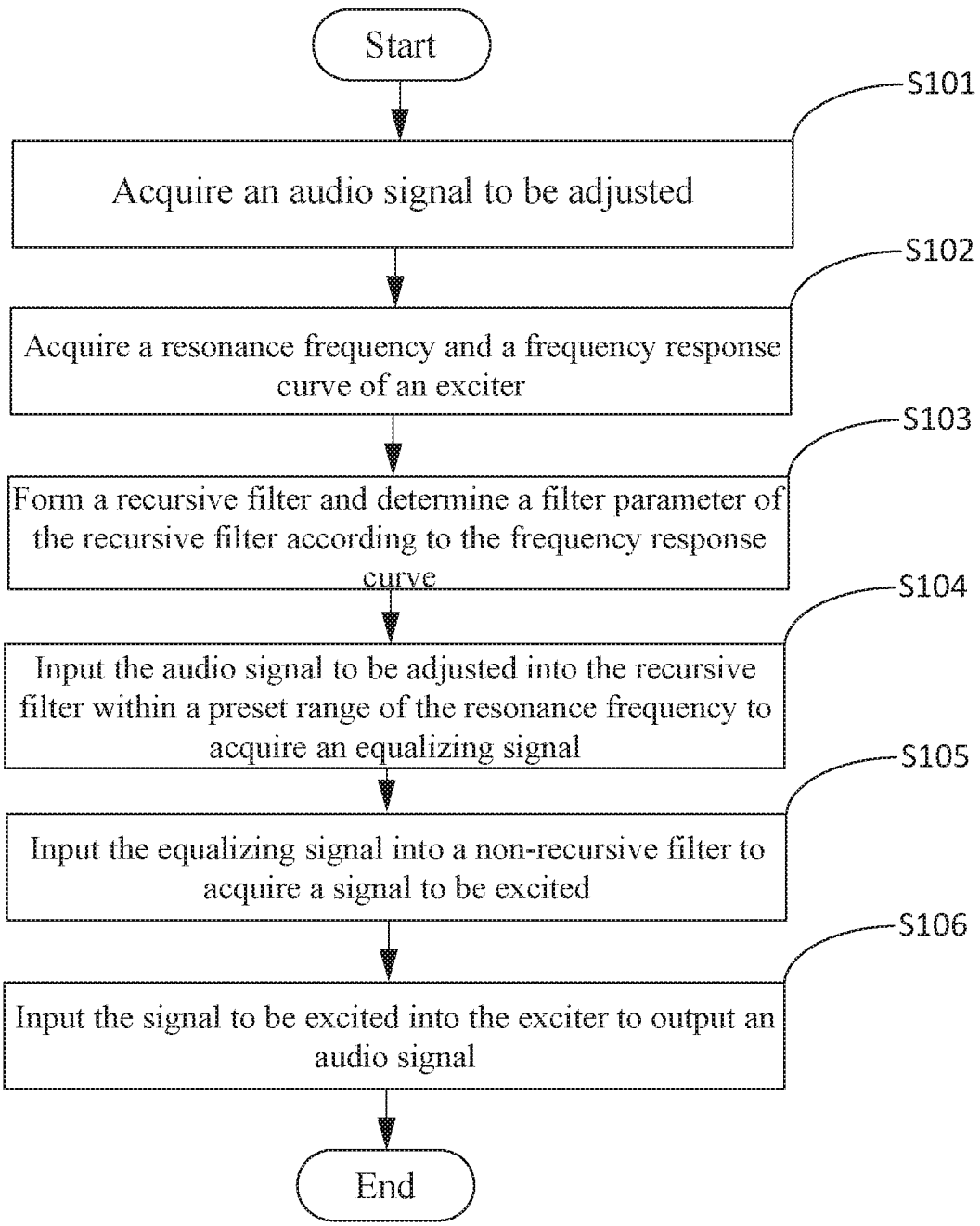
FIG. 1 is a flow chart of a method for adjusting sound quality provided by a first embodiment of the present invention.

A first embodiment of the present invention relates to a method for adjusting sound quality applied to a sounding device with an exciter. In the embodiment, the core lies in: acquiring an audio signal to be adjusted; acquiring a resonance frequency and a frequency response curve of the exciter; forming a recursive filter and determining a filter parameter of the recursive filter according to the frequency response curve; inputting the audio signal to be adjusted into the recursive filter within a preset range of the resonance frequency to acquire an equalizing signal; performing preset sound effect processing on the equalizing signal to acquire a signal to be excited, wherein the preset sound effect processing at least includes inputting the equalizing signal into a non-recursive filter; and inputting the signal to be excited into the exciter to output an audio signal. The implementation details of the method for adjusting sound quality in this embodiment will be described in detail below. The following are only the implementation details provided for convenience of understanding and are not necessary for the implementation of this embodiment. As shown in FIG. 1, the method for adjusting sound quality includes the following steps.

In S101, an audio signal to be adjusted is acquired.

Regarding step S101, specifically, during a call, a sound source will send out an audio signal, which is the audio signal to be adjusted.

In S102, a resonance frequency and a frequency response curve of the exciter are acquired.

Regarding step S102, specifically, the resonance frequency of the exciter can be acquired according to the characteristics of the exciter, and the frequency response curve of the exciter in the screen sounding device may be measured according to step signal stimulation.

In S103, a recursive filter is formed and a filter parameter of the recursive filter is determined according to the frequency response curve.

Regarding step S103, specifically, the recursive filter is a filter in signal processing with one or more output signals as an input of the recursive filter. This filter typically produces an infinite length of impulse response (commonly called infinite impulse response, or IIR for short), which is characterized by exponential growth or exponential attenuation.

In S104, the audio signal to be adjusted is inputted into the recursive filter within a preset range of the resonance frequency to acquire an equalizing signal.

Regarding step S104, specifically, according to the characteristics of the exciter, EQ (equalization) design is performed by using an IIR filter near the resonant frequency F0 (i.e., the preset range) of the exciter to avoid over-strong vibration. In the embodiment, that the audio signal to be adjusted is inputted into the recursive filter within a preset range of the resonance frequency to acquire an equalizing signal may be: performing audio adjustment on an equalizer of the recursive filter, and inputting the audio signal to be adjusted into the recursive filter after the audio adjustment within the preset range of the resonance frequency to acquire the equalizing signal.

In S105, the equalizing signal is inputted into a non-recursive filter to acquire a signal to be excited.

Regarding step S105, specifically, the equalizing signal is inputted into the non-recursive filter to acquire an isostatic compensation signal, which is the signal to be excited. The non-recursive filter, also known as a finite impulse response filter, is the most basic element in a digital signal processing system, which can ensure arbitrary amplitude-frequency characteristics and have strict linear phase-frequency characteristics. Moreover a unit sampling response of the non-recursive filter has a finite length, so that the non-recursive filter is a stable system. Therefore, the non-recursive filter is widely used in communication, image processing, pattern recognition and other fields.

In S106, the signal to be excited is inputted into the exciter to output an audio signal.

Regarding step S106, specifically, the exciter is a harmonic generator, which is a sound processing device that modifies and beautifies sound signals by using psychoacoustic characteristics of human beings. By adding high-frequency harmonic components to the sound and other methods, the sound quality, timbre and the penetration of the sound can be improved, and the spatial sense of the sound can be increased. Modern exciters can not only create high-frequency harmonics, but also have the functions of low-frequency expansion and music styles, so that bass effect is more perfect and music is more expressive.

Compared with the existing art, the embodiment of the present invention acquires the audio signal to be adjusted, the resonance frequency and the frequency response curve of the exciter, then forms the recursive filter, determines the filter parameter of the recursive filter according to the frequency response curve, inputs the audio signal to be adjusted into the recursive filter within the preset range of the resonance frequency, and then acquires the equalizing signal; performs equalization design by using the recursive filter within the preset range of the resonance frequency of the exciter, to avoid over-strong screen vibration and enhance the vibration reduction effect. By determining the filter parameter of the recursive filter according to the frequency response curve, an audio loss of the exciter in a screen sounding device can be reduced. Moreover, the signal to be excited is acquired by performing preset sound effect processing on the equalizing signal, wherein the preset sound effect processing at least includes: inputting the equalizing signal into the non-recursive filter, so that transient linear and nonlinear responses of the exciter in the screen sounding device are improved, thereby improving a sounding tone quality of the screen, causing good hearing experience to the users, and avoiding the situation that "if the speech and music effects of the screen sounding technology are not processed, the vibration effect of the screen will be obvious, while noise and voice changes will be generated when the screen vibrates, causing the sound quality to be affected, thereby causing poor hearing experience to the users".

A second embodiment of the present invention relates to a method for adjusting sound quality. The second embodiment is a further improvement on the basis of the first embodiment, and the detailed improvements lie in that: in the second embodiment, the preset sound effect processing further includes performing dynamic range adjustment on a signal outputted by the non-recursive filter to acquire a voltage limit signal; and the acquiring the signal to be excited specifically includes: using the voltage limit signal as a signal to be excited. The signal outputted by the non-recursive filter is controlled by using dynamic range adjustment, and different gains are matched according to each audio segment, so that audio outputting is softly voltage limited, a loudspeaker effect is improved, which effectively prevents the situation that "a signal level changes strongly, which leads to exceed the limit of the amplifier, thereby causing distortion".

Figure 2:
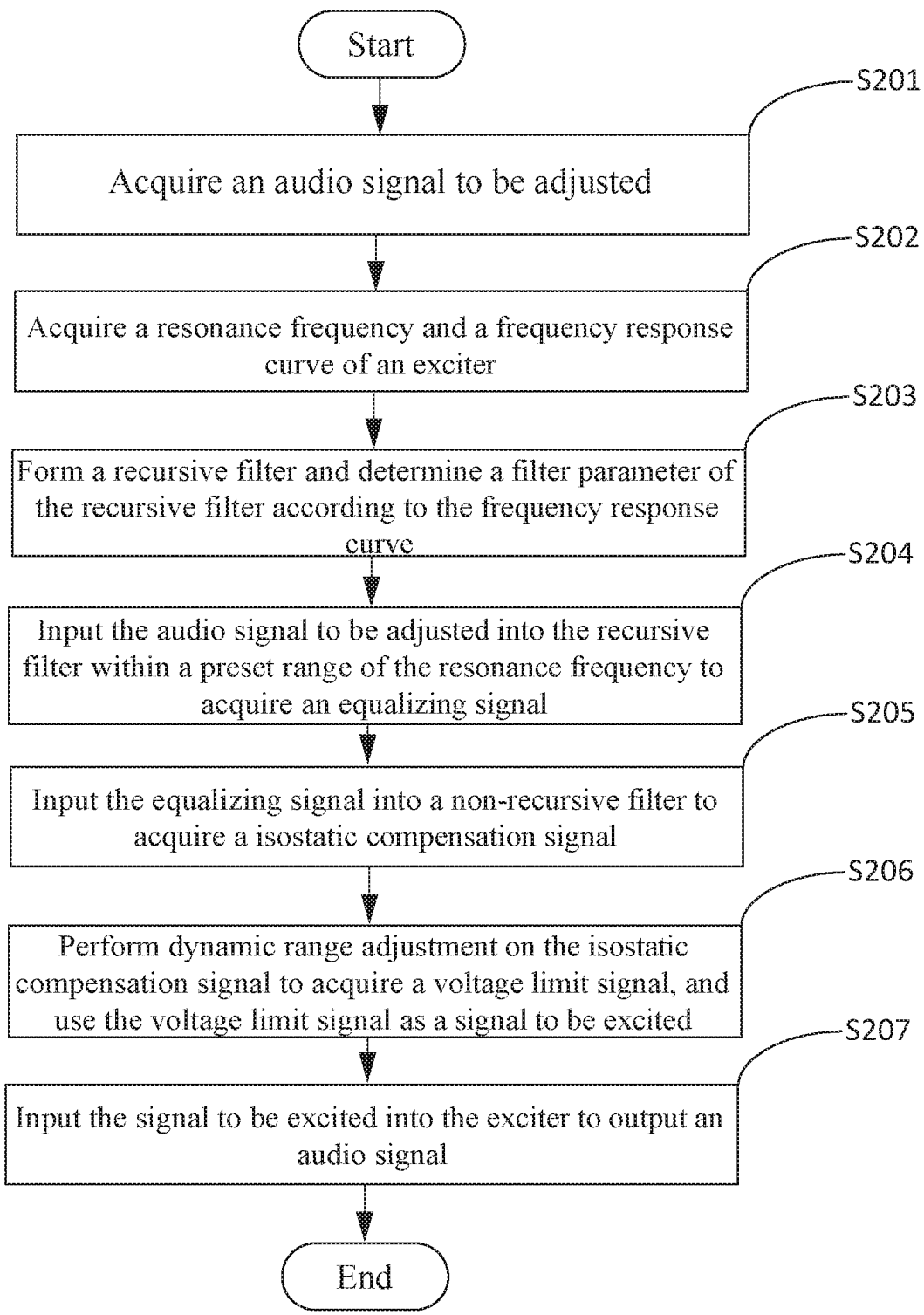
FIG. 2 is a flow chart of a method for adjusting sound quality provided by a second embodiment of the present invention.

A specific flow of this embodiment, as shown in FIG. 2, includes the following steps:

In S201, an audio signal to be adjusted is acquired.

In S202, a resonance frequency and a frequency response curve of the exciter are acquired.

In S203, a recursive filter is formed and a filter parameter of the recursive filter is determined according to the frequency response curve.

In S204, the audio signal to be adjusted is inputted into the recursive filter within a preset range of the resonance frequency to acquire an equalizing signal.

In S205, the equalizing signal is inputted into a non-recursive filter to acquire an isostatic compensation signal.

In S206, dynamic range adjustment is performed on the isostatic compensation signal to acquire a voltage limit signal, and the voltage limit signal is used as a signal to be excited.

Regarding step S206, specifically, the dynamic range control is widely used in the field of audio signal processing, which maps a dynamic range of the inputted audio signal to a specified dynamic range. Generally, the dynamic range after mapping is smaller than the dynamic range before mapping, so the dynamic range control is also called dynamic range compression. The dynamic range control may be performed on the whole audio signal, or the audio signal may be divided into a plurality of sub-bands, and the dynamic range control is performed on each sub-band separately.

In S207, the signal to be excited is inputted into the exciter to output an audio signal.

Steps S201 to S205 and S207 in this embodiment are similar to steps S101 to S106 in the first embodiment, and will not be elaborated herein to avoid repetition.

Compared with the existing art, the embodiment of the present invention acquires the audio signal to be adjusted, the resonance frequency and the frequency response curve of the exciter, then forms a recursive filter, determines the filter parameter of the recursive filter according to the frequency response curve, inputs the audio signal to be adjusted into the recursive filter within the preset range of the resonance frequency, and then acquires the equalizing signal; performs equalization design by using the recursive filter within the preset range of the resonance frequency of the exciter, to avoid over-strong screen vibration and enhance the vibration reduction effect. By determining the filter parameter of the recursive filter according to the frequency response curve, an audio loss of the exciter in a screen sounding device can be reduced. Moreover, the signal to be excited is acquired by performing preset sound effect processing on the equalizing signal, wherein the preset sound effect processing at least includes: inputting the equalizing signal into the non-recursive filter, so that transient linear and nonlinear responses of the exciter in the screen sounding device are improved, thereby improving a sounding tone quality of the screen, causing good hearing experience to the users, and avoiding the situation that "if the speech and music effects of the screen sounding technology are not processed, the vibration effect of the screen will be obvious, while noise and voice changes will be generated when the screen vibrates, causing the sound quality to be affected, thereby causing poor hearing experience to the users".

A third embodiment of the present invention relates to a method for adjusting sound quality. The third embodiment is a further improvement on the basis of the second embodiment, and the detailed improvements lie in that: in the third embodiment, the preset sound effect processing further includes: inputting the voltage limit signal into a low-pass filter and a high-pass filter to acquire a filtered signal; and the acquiring the signal to be excited specifically includes: using the filtered signal as a signal to be excited. By adding the low-pass filter and the high-pass filter, noises and susurrus can be better reduced, thereby further improving a screen sounding tone quality.

Figure 3:
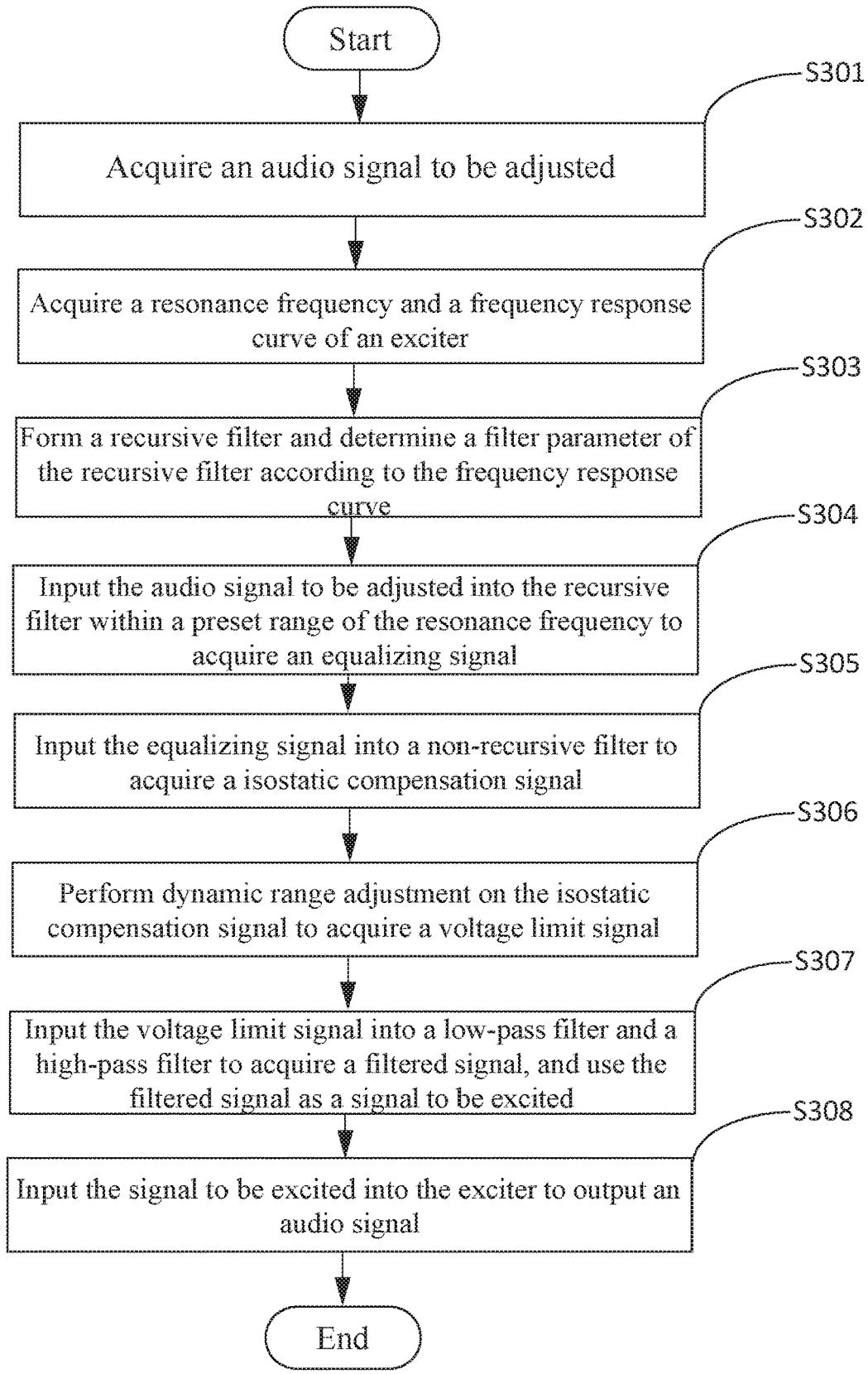
FIG. 3 is a flow chart of a method for adjusting sound quality provided by a third embodiment of the present invention.

A specific flow of this embodiment, as shown in FIG. 3, includes the following steps:

In S301, an audio signal to be adjusted is acquired.

In S302, a resonance frequency and a frequency response curve of the exciter are acquired.

In S303, a recursive filter is formed and a filter parameter of the recursive filter is determined according to the frequency response curve.

In S304, the audio signal to be adjusted is inputted into the recursive filter within a preset range of the resonance frequency to acquire an equalizing signal.

In S305, the equalizing signal is inputted into a non-recursive filter to acquire an isostatic compensation signal.

In S306, dynamic range adjustment is performed on the isostatic compensation signal to acquire a voltage limit signal.

In S307, the voltage limit signal is inputted into a low-pass filter and a high-pass filter to acquire a filtered signal, and the filtered signal is used as a signal to be excited.

Regarding step S307, specifically, the low-pass filter is an electronic filtering device that allows signals below a cut-off frequency to pass, but does not allow signals above the cut-off frequency to pass. The high-pass filter, also known as a low cut-off filter or a low resistance filter, is a filter that allows frequencies higher than a certain cut-off frequency to pass and thereby greatly attenuating lower frequencies. The high-pass filter removes unnecessary low-frequency components or low-frequency interference from the signal.

In S308, the signal to be excited is inputted into the exciter to output an audio signal.

Steps S301 to S306 and S308 in this embodiment are similar to steps S201 to S207 in the second embodiment, and will not be elaborated herein to avoid repetition.

Compared with the existing art, the embodiment of the present invention acquires the audio signal to be adjusted, the resonance frequency and the frequency response curve of the exciter, then forms the recursive filter, determines the filter parameter of the recursive filter according to the frequency response curve, inputs the audio signal to be adjusted into the recursive filter within the preset range of the resonance frequency, and then acquires the equalizing signal; performs equalization design by using the recursive filter within the preset range of the resonance frequency of the exciter, to avoid over-strong screen vibration and enhance the vibration reduction effect. By determining the filter parameter of the recursive filter according to the frequency response curve, an audio loss of the exciter in a screen sounding device can be reduced. Moreover, the signal to be excited is acquired by performing preset sound effect processing on the equalizing signal, wherein the preset sound effect processing at least includes: inputting the equalizing signal into the non-recursive filter, so that transient linear and nonlinear responses of the exciter in the screen sounding device are improved, thereby improving a sounding tone quality of the screen, causing good hearing experience to the users, and avoiding the situation that "if the speech and music effects of the screen sounding technology are not processed, the vibration effect of the screen will be obvious, while noise and voice changes will be generated when the screen vibrates, causing the sound quality to be affected, thereby causing poor hearing experience to the users".

A fourth embodiment of the present invention relates to a method for adjusting sound quality. The fourth embodiment is a further improvement on the basis of the third embodiment, and the detailed improvements lie in that: in the fourth embodiment, the preset sound effect processing further includes: performing speech and signal gain reduction on the filtered signal to acquire a sound leakage prevention signal; and the acquiring the signal to be excited specifically includes: using the sound leakage prevention signal as a signal to be excited. Based on a working mechanism of the sounding device, the signal gains of speech and music are appropriately reduced by audio software, which can reduce sound leakage and further improve the screen sounding tone quality.

Figure 4:
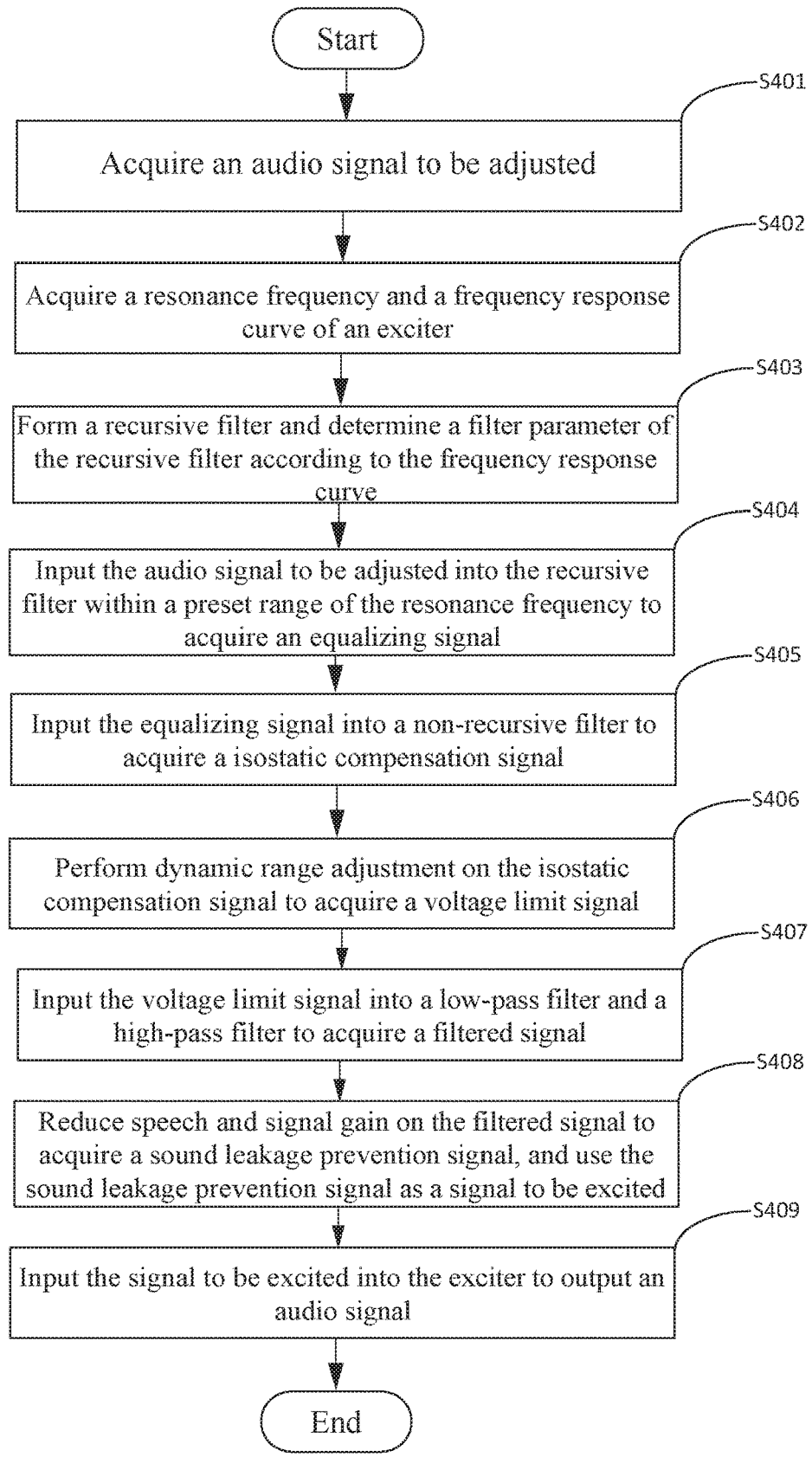
FIG. 4 is a flow chart of a method for adjusting sound quality provided by a fourth embodiment of the present invention.

A specific flow of this embodiment, as shown in FIG. 4, includes the following steps.

In S401, an audio signal to be adjusted is acquired.

In S402, a resonance frequency and a frequency response curve of the exciter are acquired.

In S403, a recursive filter is formed and a filter parameter of the recursive filter is determined according to the frequency response curve.

In S404, the audio signal to be adjusted is inputted into the recursive filter within a preset range of the resonance frequency to acquire an equalizing signal.

In S405, the equalizing signal is inputted into a non-recursive filter to acquire an isostatic compensation signal.

In S406, dynamic range adjustment is performed on the isostatic compensation signal to acquire a voltage limit signal.

In S407, the voltage limit signal is inputted into a low-pass filter and a high-pass filter to acquire a filtered signal.

In S408, speech and signal gain reduction are performed on the filtered signal to acquire a sound leakage prevention signal, and the sound leakage prevention signal is used as a signal to be excited.

Regarding step S408, specifically, based on the working mechanism of the screen sounding device, in order to reduce sound leakage, the gains of speech and music needs to be appropriately reduced by audio software.

In S409, the signal to be excited is inputted into the exciter to output an audio signal.

Steps S401 to S407 and S409 in this embodiment are similar to steps S301 to S308 in the third embodiment, and will not be elaborated herein to avoid repetition.

Compared with the existing art, the embodiment of the present invention acquires the audio signal to be adjusted, the resonance frequency and the frequency response curve of the exciter, then forms the recursive filter, determines the filter parameter of the recursive filter according to the frequency response curve, inputs the audio signal to be adjusted into the recursive filter within the preset range of the resonance frequency, and then acquires the equalizing signal; performs equalization design by using the recursive filter within the preset range of the resonance frequency of the exciter, to avoid over-strong screen vibration and enhance the vibration reduction effect. By determining the filter parameter of the recursive filter according to the frequency response curve, an audio loss of the exciter in a screen sounding device can be reduced. Moreover, the signal to be excited is acquired by performing preset sound effect processing on the equalizing signal, wherein the preset sound effect processing at least includes: inputting the equalizing signal into the non-recursive filter, so that transient linear and nonlinear responses of the exciter in the screen sounding device are improved, thereby improving a sounding tone quality of the screen, causing good hearing experience to the users, and avoiding the situation that "if the speech and music effects of the screen sounding technology are not processed, the vibration effect of the screen will be obvious, while noise and voice changes will be generated when the screen vibrates, causing the sound quality to be affected, thereby causing poor hearing experience to the users".

A fifth embodiment of the present invention relates to a method for adjusting sound quality. The fifth embodiment is a further improvement on the basis of the fourth embodiment, and the detailed improvements lie in that: in the fifth embodiment, the preset sound effect processing further includes: amplifying the sound leakage prevention signal on efficacy; and the acquiring the signal to be excited specifically includes: using the sound leakage prevention signal amplified on efficacy as a signal to be excited.

Figure 5:
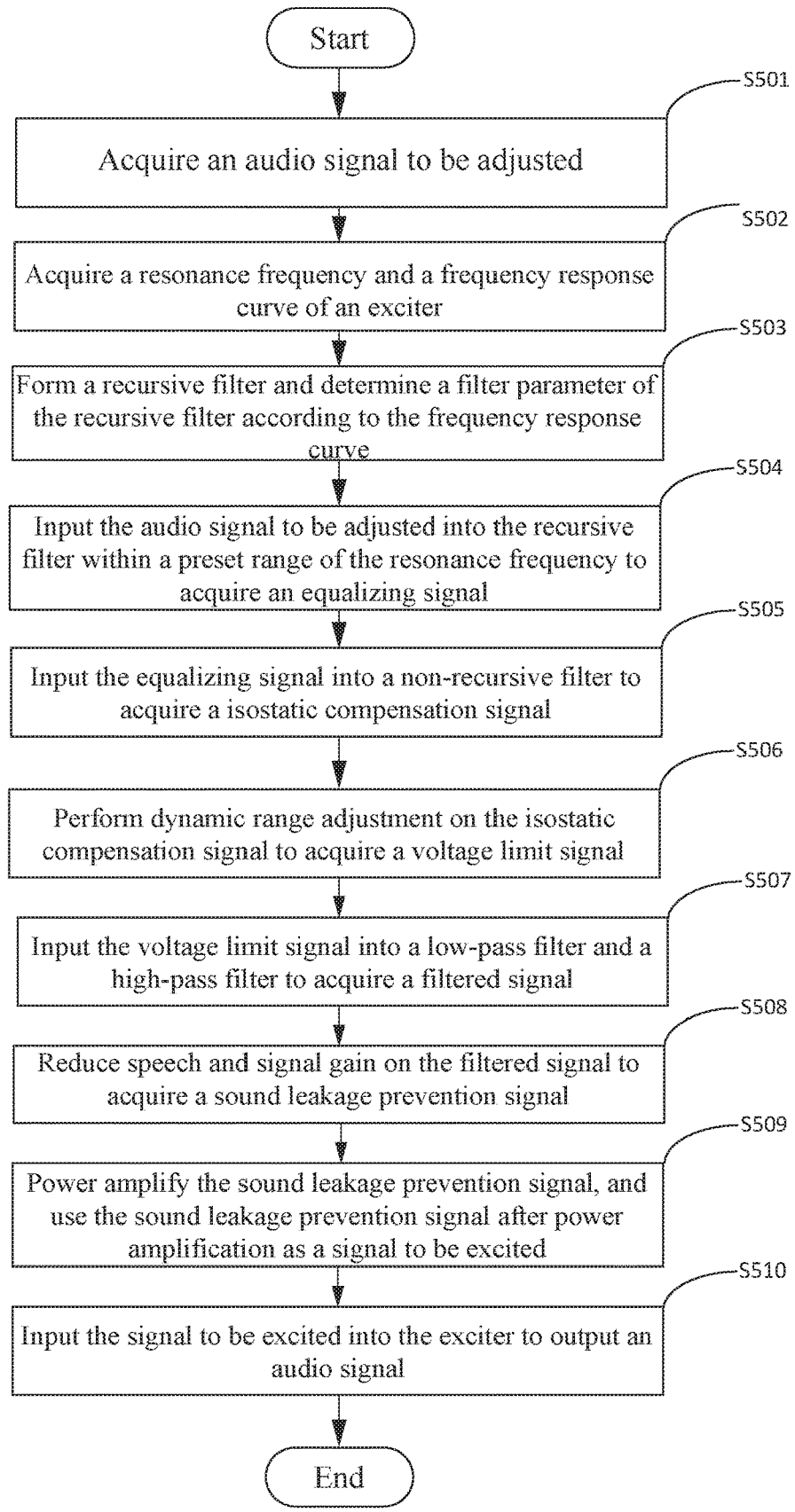
FIG. 5 is a flow chart of a method for adjusting sound quality provided by a fifth embodiment of the present invention.

A specific flow of this embodiment, as shown in FIG. 5, includes the following steps.

In S501, an audio signal to be adjusted is acquired.

In S502, a resonance frequency and a frequency response curve of the exciter are acquired.

In S503, a recursive filter is formed and a filter parameter of the recursive filter is determined according to the frequency response curve.

In S504, the audio signal to be adjusted is inputted into the recursive filter within a preset range of the resonance frequency to acquire an equalizing signal.

In S505, the equalizing signal is inputted into a non-recursive filter to acquire an isostatic compensation signal.

In S506, dynamic range adjustment is performed on the isostatic compensation signal to acquire a voltage limit signal.

In S507, the voltage limit signal is inputted into a low-pass filter and a high-pass filter to acquire a filtered signal.

In S508, speech and signal gain reduction is performed on the filtered signal to acquire a sound leakage prevention signal.

In S509, the sound leakage prevention signal is amplified, and the sound leakage prevention signal amplified is used as a signal to be excited.

Regarding step S509, specifically, a function of a power amplifier is to amplify a weak signal from a sound source or a previous amplifier to push a loudspeaker box to sound. A power amplifier of an excellent sound system plays an important role. In the embodiment, the amplifying the sound leakage prevention signal specifically includes: amplifying the sound leakage prevention signal according to a preset voltage and a preset power amplifying multiple.

In S510, the signal to be excited is inputted into the exciter to output an audio signal.

Steps S501 to S508 and S510 in this embodiment are similar to steps S401 to S409 in the fourth embodiment, and will not be elaborated herein to avoid repetition.

It is worth mentioning that in order to meet the sound effect requirements of different screen sounding devices, different emphases may be put during the debugging process of the sounding device, wherein the details are as follows;

(1) High Sound Quality and Strong Reducibility are Required

A preset voltage is set to be less than a maximum voltage of the recursive filter, a preset power amplifying multiple is set to be less than a maximum power amplifying multiple, and a low frequency and a medium-high frequency of the equalizer is set evenly, so that a difference between the low frequency and the medium-high frequency falls in a preset range. In other words, a maximum gain of the power amplifier has a certain allowance, the maximum voltage is not used for output, and a change rate of the amplifying multiple is relatively gentle. Signal clipping is not allowed; and EQ is set evenly.

(2) Sufficient Bass is Required the preset voltage is set to be less than the maximum voltage of the recursive filter, and the preset power amplifying multiple is set to be less than the maximum power amplifying multiple; and the low frequency of the equalizer is increased to a first preset threshold, and the medium-high frequency of the equalizer is reduced to a second preset threshold. In other words, the maximum gain of the power amplifier has a certain allowance, the maximum voltage is not used for output, and the change rate of the amplifying multiple is relatively gentle. Signal clipping is not allowed; the low frequency is appropriately increased while the medium-high frequency is appropriately reduced for setting the EQ.

(3) High Volume is Required

The preset voltage is set to be the maximum voltage of the recursive filter, and the preset power amplifying multiple is set to be the maximum power amplifying multiple; and the low frequency of the equalizer is reduced to a third preset threshold, the medium-high frequency of the equalizer is increased to a fourth preset threshold, and a bandwidth of the equalizer is reduced to a fifth preset threshold. In other words, the maximum gain of the power amplifier is as large as possible, the maximum voltage is used for output, and the change rate of the amplifying multiple is accelerated; appropriate signal clipping is allowed; the low frequency is appropriately reduced, the medium-high frequency is appropriately increased, and the bandwidth is appropriately reduced for setting the EQ.

Figure 6:
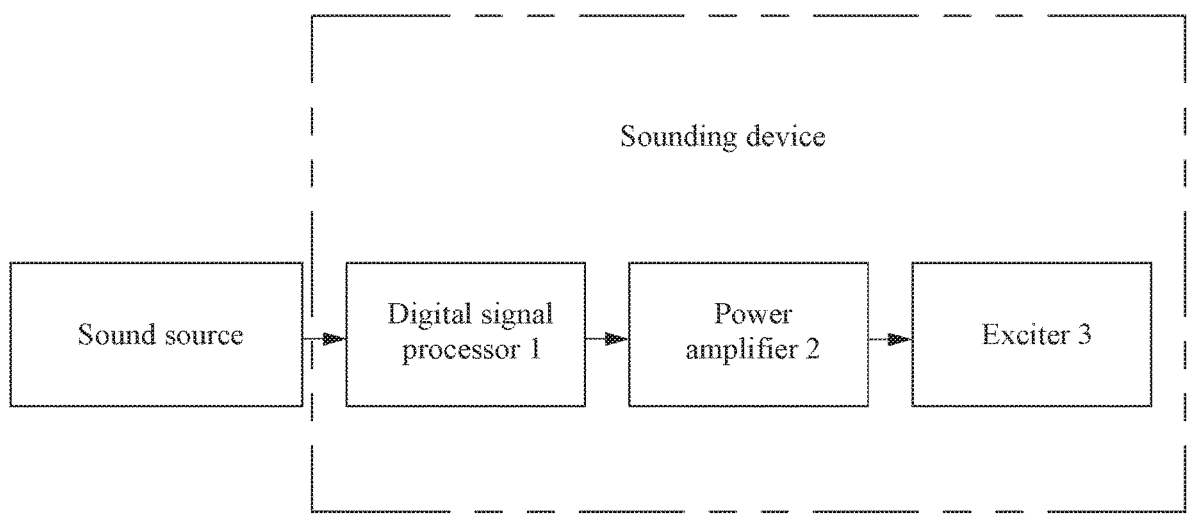
FIG. 6 is an internal block diagram of a sounding device provided by the fifth embodiment of the present invention.

It should be noted that an internal circuit block diagram of the screen sounding device in this embodiment is shown in FIG. 6, which includes a digital signal processor (DSP) 1, a power amplifier 2, and an exciter 3. In order to facilitate understanding, the working principle of the sounding device in this embodiment will be described in detail below:

During a call, a sound source sends out an audio signal. The audio signal is supplied to the exciter 3 through the digital signal processor 1 and the power amplifier 2. Specifically, the digital signal processor 1 performs sound effect processing on the signal, such as sound filtering and equalization design, DRC (dynamic range control), etc. It is to be understood that it is sufficient to select a conventional audio power amplifier chip, which requires a maximum output voltage Vmax to be no less than 7 Vp (peak voltage) and an output power to be no less than 1 W. The exciter 3 needs to be attached to the screen, with installation gaps reserved around to ensure that the exciter 3 does not touch peripheral devices, and a gap is reserved on a top surface, or foam is used to apply certain pre-pressure on a top portion of the exciter.

Compared with the existing art, the embodiment of the present invention acquires the audio signal to be adjusted, the resonance frequency and the frequency response curve of the exciter, then forms the recursive filter, determines the filter parameter of the recursive filter according to the frequency response curve, inputs the audio signal to be adjusted into the recursive filter within the preset range of the resonance frequency, and then acquires the equalizing signal; performs equalization design by using the recursive filter within the preset range of the resonance frequency of the exciter, to avoid over-strong screen vibration and enhance the vibration reduction effect. By determining the filter parameter of the recursive filter according to the frequency response curve, an audio loss of the exciter in a screen sounding device can be reduced. Moreover, the signal to be excited is acquired by performing preset sound effect processing on the equalizing signal, wherein the preset sound effect processing at least includes: inputting the equalizing signal into the non-recursive filter, so that transient linear and nonlinear responses of the exciter in the screen sounding device are improved, thereby improving a sounding tone quality of the screen, causing good hearing experience to the users, and avoiding the situation that "if the speech and music effects of the screen sounding technology are not processed, the vibration effect of the screen will be obvious, while noise and voice changes will be generated when the screen vibrates, causing the sound quality to be affected, thereby causing poor hearing experience to the users".

Figure 7:
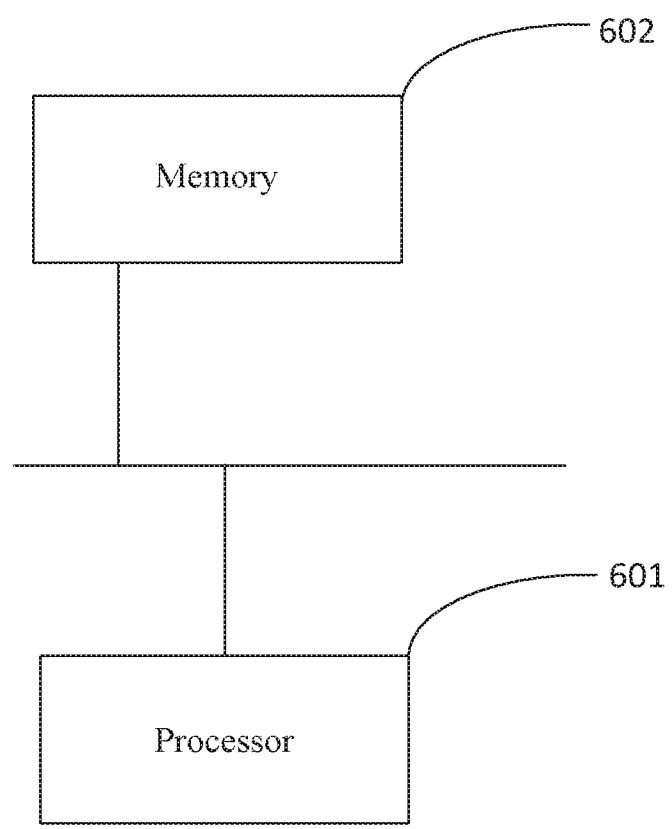
FIG. 7 is a schematic structure diagram of a device for adjusting sound quality provided by a sixth embodiment of the present invention.

A sixth embodiment of the present invention relates to a device for adjusting sound quality, as shown in FIG. 7, including:

at least one processor 601; and, a memory 602 communicated with the at least one processor 601, wherein:

the memory 602 stores an instruction executable by the at least one processor 601, and the instruction is executed by the at least one processor 601 to enable the at least one processor 601 to execute the method for adjusting the sound quality mentioned above.

The memory 602 and the processor 601 are connected by a bus that may include any number of interconnected buses and bridges, and the bus links various circuits of one or more processors 601 and the memory 602 together. The bus may also link various other circuits of peripherals, regulators, power management circuits, etc., which are well known in the art, and therefore will not be described further herein. A bus interface provides an interface between the bus and a transceiver. The transceiver may be one element or a plurality of elements, such as a plurality of receivers and transmitters, providing a unit for communicating with various other devices over a transmission medium. Data processed by the processor 601 is transmitted over a wireless medium through an antenna. Further, the antenna also receives data and transmits the data to the processor 601.

The processor 601 is responsible for managing the bus and normal processing, and may further provide various functions including timing, peripheral interfaces, voltage regulation, power management, and other control functions. The memory 602 may be configured to store data used by the processor 601 in performing operations.

Those of ordinary skill in the art can understand that the above embodiments are specific embodiments for implementing the invention, and in practical applications, various changes in form and detail can be made without departing from the spirit and scope of the invention.

What is claimed is:

1. A method for adjusting sound quality, applied to a sounding device with an exciter, and comprising:

acquiring an audio signal to be adjusted;

acquiring a resonance frequency and a frequency response curve of the exciter;

forming a recursive filter and determining a filter parameter of the recursive filter according to the frequency response curve;

inputting the audio signal to be adjusted into the recursive filter within a preset range of the resonance frequency to acquire an equalizing signal;

performing preset sound effect processing on the equalizing signal to acquire a signal to be excited, wherein the preset sound effect processing at least comprises inputting the equalizing signal into a non-recursive filter; and inputting the signal to be excited into the exciter to output an audio signal.

2. The method for adjusting sound quality according to claim 1, wherein the preset sound effect processing further comprises performing dynamic range adjustment on a signal outputted by the non-recursive filter to acquire a voltage limit signal; and the acquiring the signal to be excited specifically comprises: using the voltage limit signal as a signal to be excited.

3. The method for adjusting sound quality according to claim 2, wherein the preset sound effect processing further comprises inputting the voltage limit signal into a low-pass filter and a high-pass filter to acquire a filtered signal; and the acquiring the signal to be excited specifically comprises: using the filtered signal as a signal to be excited.

4. The method for adjusting sound quality according to claim 3, wherein the preset sound effect processing further comprises performing speech and signal gain reduction on the filtered signal to acquire a sound leakage prevention signal; and the acquiring the signal to be excited specifically comprises: using the sound leakage prevention signal as a signal to be excited.

5. The method for adjusting sound quality according to claim 4, wherein the preset sound effect processing further comprises power amplifying the sound leakage prevention signal; and the acquiring the signal to be excited specifically comprises: using the sound leakage prevention signal after power amplification as a signal to be excited.

6. The method for adjusting sound quality according to claim 5, wherein the inputting the audio signal to be adjusted into the recursive filter within the preset range of the resonance frequency to acquire the equalizing signal specifically comprises:

performing audio adjustment on an equalizer of the recursive filter, and inputting the audio signal to be adjusted into the recursive filter after the audio adjustment within the preset range of the resonance frequency to acquire the equalizing signal;

wherein the power amplifying the sound leakage prevention signal specifically comprises:

power amplifying the sound leakage prevention signal according to a preset voltage and a preset power amplifying multiple.

7. The method for adjusting sound quality according to claim 6, wherein the preset voltage is less than a maximum voltage of the recursive filter, and the preset power amplifying multiple is less than a maximum power amplifying multiple; and the performing the audio adjustment on the equalizer of the recursive filter specifically comprises: evenly setting a low frequency and a medium-high frequency of the equalizer, such that a difference between the low frequency and the medium-high frequency fall in a preset range.

8. The method for adjusting sound quality according to claim 6, wherein the preset voltage is less than a maximum voltage of the recursive filter, and the preset power amplifying multiple is less than a maximum power amplifying multiple; and
the performing the audio adjustment on the equalizer of the recursive filter specifically comprises: increasing the low frequency of the equalizer to a first preset threshold, and reducing the medium-high frequency of the equalizer to a second preset threshold.

9. The method for adjusting sound quality according to claim 6, wherein the preset voltage is a maximum voltage of the recursive filter, and the preset power amplifying multiple is a maximum power amplifying multiple; and
the performing the audio adjustment on the equalizer of the recursive filter specifically comprises: reducing the low frequency of the equalizer to a third preset threshold, increasing the medium-high frequency of the equalizer to a fourth preset threshold, and reducing a bandwidth of the equalizer to a fifth preset threshold.

10. A device for adjusting sound quality, comprising:
at least one processor, and,
a memory communicated with the at least one processor,
wherein the memory is configured to store an instruction executable by the at least one processor, and the instruction is executed by the at least one processor to enable the at least one processor to execute a method for adjusting sound quality, wherein:
the method comprises:
acquiring an audio signal to be adjusted;
acquiring a resonance frequency and a frequency response curve of the exciter;
forming a recursive filter and determining a filter parameter of the recursive filter according to the frequency response curve;
inputting the audio signal to be adjusted into the recursive filter within a preset range of the resonance frequency to acquire an equalizing signal;
performing preset sound effect processing on the equalizing signal to acquire a signal to be excited, wherein the preset sound effect processing at least comprises inputting the equalizing signal into a non-recursive filter; and
inputting the signal to be excited into the exciter to output an audio signal.

11. The device for adjusting sound quality according to claim 10, wherein the preset sound effect processing further comprises performing dynamic range adjustment on a signal outputted by the non-recursive filter to acquire a voltage limit signal; and
the acquiring the signal to be excited specifically comprises: using the voltage limit signal as a signal to be excited.

12. The device for adjusting sound quality according to claim 11, wherein the preset sound effect processing further comprises inputting the voltage limit signal into a low-pass filter and a high-pass filter to acquire a filtered signal; and
the acquiring the signal to be excited specifically comprises: using the filtered signal as a signal to be excited.

13. The device for adjusting sound quality according to claim 12, wherein the preset sound effect processing further comprises performing speech and signal gain reduction on the filtered signal to acquire a sound leakage prevention signal; and
the acquiring the signal to be excited specifically comprises: using the sound leakage prevention signal as a signal to be excited.

14. The device for adjusting sound quality according to claim 13, wherein the preset sound effect processing further comprises power amplifying the sound leakage prevention signal; and
the acquiring the signal to be excited specifically comprises: using the sound leakage prevention signal after power amplification as a signal to be excited.

15. The device for adjusting sound quality according to claim 14, wherein the inputting the audio signal to be adjusted into the recursive filter within the preset range of the resonance frequency to acquire the equalizing signal specifically comprises:
performing audio adjustment on an equalizer of the recursive filter; and
inputting the audio signal to be adjusted into the recursive filter after the audio adjustment within the preset range of the resonance frequency to acquire the equalizing signal;
wherein the power amplifying the sound leakage prevention signal specifically comprises:
power amplifying the sound leakage prevention signal according to a preset voltage and a preset power amplifying multiple.

16. The device for adjusting sound quality according to claim 15, wherein the preset voltage is less than a maximum voltage of the recursive filter, and the preset power amplifying multiple is less than a maximum power amplifying multiple; and
the performing the audio adjustment on the equalizer of the recursive filter specifically comprises: evenly setting a low frequency and a medium-high frequency of the equalizer, such that a difference between the low frequency and the medium-high frequency fall in a preset range.

17. The device for adjusting sound quality according to claim 15, wherein the preset voltage is less than a maximum voltage of the recursive filter, and the preset power amplifying multiple is less than a maximum power amplifying multiple; and
the performing the audio adjustment on the equalizer of the recursive filter specifically comprises: increasing the low frequency of the equalizer to a first preset threshold, and reducing the medium-high frequency of the equalizer to a second preset threshold.

18. The device for adjusting sound quality according to claim 15, wherein the preset voltage is a maximum voltage of the recursive filter, and the preset power amplifying multiple is a maximum power amplifying multiple; and
the performing the audio adjustment on the equalizer of the recursive filter specifically comprises: reducing the low frequency of the equalizer to a third preset threshold, increasing the medium-high frequency of the equalizer to a fourth preset threshold, and reducing a bandwidth of the equalizer to a fifth preset threshold.

\* \* \* \* \*